United States Patent [19]

Voboril

[11] Patent Number: 4,911,783

[45] Date of Patent: Mar. 27, 1990

[54] PROCESS FOR ETCHING RECESSES IN A SILICON SUBSTRATE

[75] Inventor: Jan Voboril, Nussbaumen, Switzerland

[73] Assignee: BBC Brown Boveri AG, Baden, Switzerland

[21] Appl. No.: 181,157

[22] Filed: Apr. 13, 1988

[30] Foreign Application Priority Data

Apr. 15, 1987 [CH] Switzerland .................. 1475/87-7

[51] Int. Cl.$^4$ .......................................... H07L 21/306
[52] U.S. Cl. ................................... 156/643; 156/654;
   156/659; 156/659.1; 156/662
[58] Field of Search ............ 156/643, 654, 657, 659.1, 156/662

[56] References Cited

U.S. PATENT DOCUMENTS

| | | | |
|---|---|---|---|
| 3,772,102 | 11/1973 | Tiemann et al. | 156/662 |
| 3,878,008 | 4/1975 | Gleason et al. | 156/662 |
| 3,980,580 | 9/1976 | Takamiya et al. | 148/188 |
| 4,225,229 | 3/1981 | Morcom | 156/662 |
| 4,261,791 | 4/1981 | Shwartzman | 156/662 |
| 4,405,405 | 9/1983 | Fujii et al. | 156/659.1 |
| 4,405,709 | 9/1983 | Katano et al. | 156/659.1 |
| 4,417,947 | 11/1983 | Pan | 156/659.1 |
| 4,425,183 | 1/1984 | Maheras et al. | 156/659.1 |
| 4,484,979 | 11/1984 | Stocker | 156/659.1 |
| 4,497,684 | 2/1985 | Sebesta | 156/659.1 |
| 4,502,915 | 3/1985 | Carter et al. | 156/659.1 |
| 4,505,026 | 3/1985 | Bohr et al. | 156/659.1 |
| 4,579,812 | 4/1986 | Bower | 430/313 |
| 4,613,404 | 9/1986 | Takei | 156/659.1 |
| 4,624,740 | 11/1986 | Abrams et al. | 156/659.1 |
| 4,678,538 | 7/1987 | Haond et al. | 156/662 |
| 4,708,765 | 11/1987 | Newman et al. | 156/345 |
| 4,773,964 | 9/1988 | Haond et al. | 156/662 |
| 4,787,997 | 11/1988 | Saito et al. | 156/662 |
| 4,799,991 | 1/1989 | Dockrey | 156/662 |

FOREIGN PATENT DOCUMENTS 0178387 7/1985 .
5526670 2/1980 Japan .
2359511 6/1975 Netherlands .
2651125 5/1977 Netherlands .

OTHER PUBLICATIONS

Schwartz, Robbins Chemical Etching of Silicon, J. Electrochem. Soc: J of Solid St. Tech., 12/76, pp. 1903-1909.

Primary Examiner—David L. Lacey
Assistant Examiner—Lou Ann Johnson
Attorney, Agent, or Firm—Oblon, Spivak, McClelland, Maier & Neustadt

[57] ABSTRACT

In a process for etching complicatedly structured recesses in a silicon substrate, in which acid mixtures containing HF and HNO$_3$ are used, the problems occurring with a photoresist mask are avoided, on the one hand, by using an SiO$_2$ mask layer and on the other hand, by fabricating the mask layer beforehand with a thickness profile corresponding to the depth profile to be etched, thereby completely separating the masking and etching steps from each other.

9 Claims, 3 Drawing Sheets

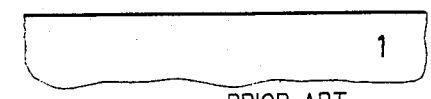
FIG.2A PRIOR ART
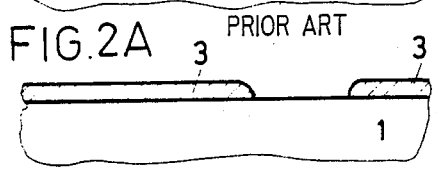
FIG.2B PRIOR ART
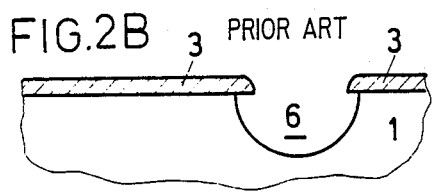
FIG.2C PRIOR ART
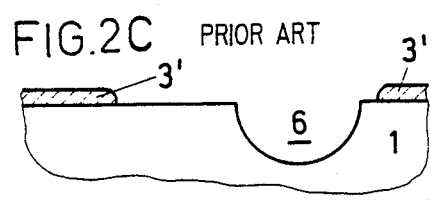
FIG.2D PRIOR ART
FIG.2E PRIOR ART
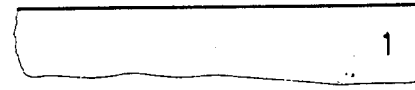
FIG.3A
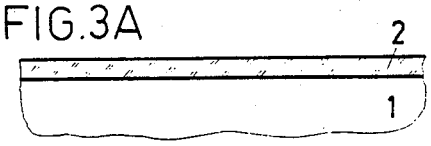
FIG.3B
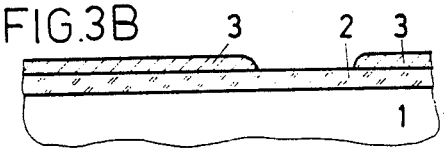
FIG.3C
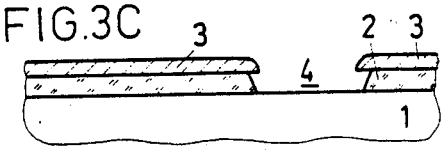
FIG.3D
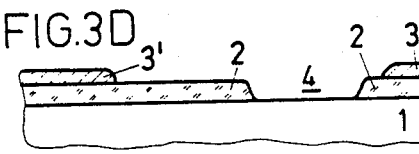
FIG.3E
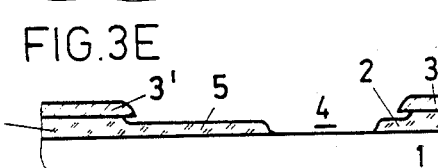
FIG.3F
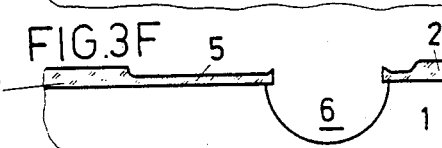
FIG.3G
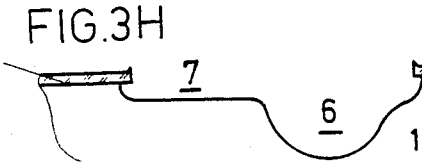
FIG.3H
FIG.3I

PROCESS FOR ETCHING RECESSES IN A SILICON SUBSTRATE

FIELD OF THE INVENTION

The present invention relates to the field of semiconductor technology. It relates, in particular, to a process for etching recesses in a silicon substrate, in which recesses with varying depth profile are produced, and in which process the silicon substrate is coated with an etch-resistant mask layer;

the mask layer is structured; and the recesses are wet-chemically etched with an etching mixture containing HF and $HNO_3$.

DISCUSSION OF BACKGROUND

To produce various topological structures in a silicon substrate, for example passivation trenches in a power thyristor, use is frequently made of isotropically acting acid mixtures.

The commonest acid mixtures are composed of hydrofluoric acid (HF) and nitric acid ($HNO_3$) and are diluted with acetic acid ($CH_3COOH$ or $HC_2H_3O_2$), water or other additives. As is known from the paper by B. Schwartz and H. Robbins, "Chemical Etching of Silicon", *J. Electrochem. Soc.*, Vol. 123, No. 12 (December 1976), pages 1903–1909 (see FIGS. 8 and 9 therein), the composition of the acid mixture determines the etching rate, but also the topological structure of the etched surface or the pattern of the contours produced if etching is carried out with masking.

As is evident from FIG. 8 of the publication cited, the etching rate reaches a maximum if HF and $HNO_3$ are mixed in a ratio of about 7:3 and are consequently in stoichiometric equilibrium.

On the basis of such a mixing ratio, the etching rate can be controlled by adding $CH_3COOH$. If the acid mixture contains more than 40% of acetic acid, the etching rate finally drops virtually to zero.

As already mentioned, the structure of the etched surface is likewise determined by the composition of the acid mixture. In this connection, it is evident from the corresponding FIG. 9 of the cited publication that the abovementioned stoichiometric composition does not yield a desirable surface quality. In addition, the high etching rate associated with this composition is not exactly desirable since the etching process is more difficult to control.

If it is desired to etch in a controlled manner and to achieve smooth and bright surfaces, the HF:$HNO_3$ ratio has to be altered in favor of nitric acid. The reason for this is that the solution of the resultant $SiO_2$ produced by the hydrofluoric acid consequently becomes the factor limiting the etching rate, and crystal defects, doping and orientation have almost no effect on the etching rate. The $HNO_3$-rich etching mixtures have, in particular, a polishing action.

If it is then desired to etch structures in a silicon substrate, the parts of the surface which are not to be etched have to be coated (masked).

In this connection it is known (see, for example, German Offenlegungsschrift No. 3,334,095) that use is made for such masking of photoresists which are applied, with or without additional adhesion layer, to the silicon substrate and are then photolithographically structured. If photoresist is used, however, a further factor, which limits the choice of the acid mixture, has to be taken into consideration, since the photoresist is in general attacked by $HNO_3$.

To etch the structures with a fineness of down to 10 μm or still finer, a negative-working photoresist is normally used as etching mask because positive-working photoresists are unusable as etching mask because of their considerably lower resistance to the usual acid mixtures.

All in all, the use of photoresists has a number of disadvantages:

(1) The choice of the acid mixture is considerably limited. The HF:$HNO_3$ should be greater than 1:3. Acid mixtures which contain 100% strength $HNO_3$ and yield reflecting surfaces attack the photoresist within a few seconds and the etching process cannot therefore be masked in this manner.

(2) The resistance of the photoresist, even to less agressive acid mixtures, is dependent on several factors (such as, for example, resist thickness, predrying, exposure, resist age) and the etching bath temperature has to be lowered in order to extend said resistance.

(3) Like the resist resistance, the resist adhesion (in particular without additional adhesion layer) is dependent on the photolithographic process, but also on the surface quality of the silicon substrate. As a rule, the resist adhesion is greater on a rough silicon surface. The masking of a polished surface, which is specifically desirable for other reasons, presents considerable problems (on this point see also German Offenlegungsschrift No. 3,334,095). In particular, the edge of the resist is severely stressed since, as a result of the underetching, the acid acquires access to the lower soft layers of resist and consequently brings about an accelerated underetching.

(4) The surface life of the resist starts to expire with the initial immersion in the acid mixture. The surface life of the resist in the acid mixture is only a few minutes and is shortened in a rather undefined manner by interrupting the etching process so that controlled continuation of the etching process is not possible after an interruption.

(5) In the photoresist process, extremely thin resist residues are left behind after the removal of the unexposed resist areas by the developer. Said resist residues produce a nonuniform removal by etching in the initial etching phase, and this results in a rough surface. In addition, this roughness does not disappear completely because the etching mixtures concerned have weaker polishing characteristics.

(6) During the etching, the photoresist swells and the acid mixture may be degraded by the organic substances.

(7) After the etching process, the resist has to be removed, and this is again carried out with organic substances. These contaminate the freshly etched silicon surface, and this has a very adverse effect on the electrical characteristics of the semiconductor structures produced and makes a complicated post-treatment necessary.

In addition to these disadvantages generally associated with a photoresist mask, further problems occur if recesses which have a varying depth profile are to be etched into the silicon substrate.

Such recesses with varying depth profile may, for example, be trenches with a bevel such as are known from German Patent No. 2,359,511 or stepped double trenches (socalled "double moats") such as are known as passivation trenches from EP-A2-0,178,387 (FIG. 2).

The process for producing the bevelled trench known from German Patent No. 2,359,511 relies on a very specific etching mixture and orientation of the silicon substrate and is unsuitable, in particular, for producing recesses with other types of depth profiles (for example, the double trenches).

On the other hand, in etching a double trench, for example, a masking step would have to be included yet again between two etching steps (for each of the trenches), in which case the already structured surface presents problems in applying (spinning on) and developing the photoresist.

SUMMARY OF THE INVENTION

Accordingly, the object of this invention is to provide a process for etching recesses with varying depth profile in a silicon substrate, which process avoids, on the one hand, the disadvantages associated with a photoresist mask and may be used, on the other hand, to produce any desired depth profiles.

This object is achieved in a process of the type mentioned in the introduction which comprises
using an SiO$_2$ mask layer;
producing regions with varying thickness profile of the mask layer whilst structuring the mask layer; and
using the regions with varying thickness profile to produce the varying depth profile of the recesses.

The essence of the invention is to be perceived in the fact that an SiO$_2$ mask layer, which acquires a varying thickness profile from the very start owing to the structuring, is used as mask, said thickness profile corresponding to the varying depth profile to be etched subsequently, so that the various etching depths can be achieved with a single mask layer.

The mask technique according to the invention has the following advantages:

(1) The choice of the acid mixture is unlimited in the HNO$_3$ direction since the SiO$_2$ mask layer is attacked only by HF. Even HNO$_3$-rich polishing and otherwise unmaskable acid mixtures (including those containing 100% strength HNO$_3$) can therefore be used. Even positive-working photoresists can be used for structuring the SiO$_2$ layer. The etching of the SiO$_2$ layer itself is in any case a largely established and satisfactorily mastered technology.

(2) The resistance of the SiO$_2$ layer is determined only by the acid mixture. The Si:SiO$_2$ etching ratio is even temperature-dependent so that the etching can be carried out within a large temperature range.

(3) The adhesion of the mask layer does not present any problems, in particular if the SiO$_2$ is thermally grown in accordance with a preferred embodiment of the invention. Thermally grown SiO$_2$, in particular, forms a compact material with the silicon substrate. A polished surface is of advantage in this case, because the SiO$_2$ layer is then particularly uniform. The mask edge is perfectly protected by the etching process itself: the etching mixture, which employs an excess of HNO$_3$, is depleted locally of the HF constituent by the etching process above the unmasked Si. As a result of this, the removal of the SiO$_2$ mask layer is reduced at this exposed point. This reduced etching rate at the mask edge has actually been observed in experiments and, depending on etching mixture and structure, is 9–14% below the etching rate on a continuous SiO$_2$ layer.

(4) The service life of the SiO$_2$ mask layer is not affected uncontrollably by an interruption in the etching process. The etching process may be interrupted several times for inspection purposes without the mask suffering as a result. This has the advantage, moreover, that it is possible to transfer to another etching bath after the interruption and the choice of the other etching solution can be subordinated to other criteria (for example, leakage current reduction).

(5) The SiO$_2$ mask layer permits all the usual cleaning procedures for the silicon substrate which are necessary to remove organic and metallic impurities. Organic substances are no longer present in the etching process itself so that the acid mixture cannot be degraded.

(6) In principle, the SiO$_2$ mask does not have to be removed immediately after the etching process: since the structure involving the SiO$_2$ layer is very resistant, other processes (for example the passivation) may follow, and the removal of the SiO$_2$ mask or parts thereof at points at which, for example, contact is to be made, may be postponed to a subsequent point in time in the process sequence.

(7) In etching complicated structures with varying depth profile, in particular, the desired structure can be prefabricated on a reduced scale in terms of thickness in the SiO$_2$ mask layer so that only etching steps follow, without the need for remasking in between. Masking and etching are consequently separate parts of the process. The masking itself is carried out on the plane surface and is therefore not impaired by structures already present.

According to a preferred exemplary embodiment of the invention, the mask layer is composed of thermally grown SiO$_2$ and an HNO$_3$-rich polishing acid mixture is used as etching mixture.

Further exemplary embodiments emerge from the subclaims.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing. In this:

FIGS. 2A–E show various steps in the etching of a double trench (double moat) with conventional photoresist masking;

FIGS. 3A–I show various steps in the etching of a double trench according to a first exemplary embodiment of the invention;

DESCRIPTION OF THE PREFERRED EMBODIMENTS

In the process according to the invention, the acid mixture containing HF, $HNO_3$ and also $CH_3COOH$ (or $HC_2H_3O_2$) used as etching mixture plays an important part.

Figure 1:
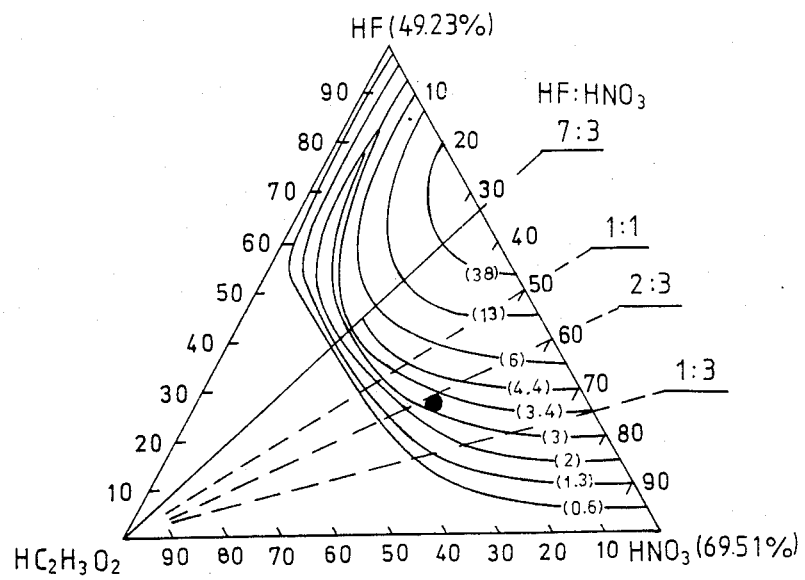
FIG. 1 shows the known representation of the etching rates in the HF—HNO$_3$—CH$_3$COOH mixture system.

Referring now to the drawing, FIG. 1 therefore essentially reproduces FIG. 8 from the paper by Schwartz and Robbins mentioned in the introduction in which the constant etching rate curves (specified in mil/minute) have been plotted for the three-component $HF$-$HNO_3$-$CH_3COOH$ mixture system. In interpreting this representation, it should be borne in mind that the starting point for the acids HF and $HNO_3$ is formed by the concentrations specified in brackets.

In addition to the constant etching rate curves, constant $HF$:$HNO_3$ mixing ratio lines are plotted for selected ratios (7:3; 1:1; 2:3 and 1:3).

As has already been explained in the introduction, the highest etching rates result for the stoichiometric mixture along the line appertaining to the ratio 7:3. For the ratio of 2:3 there is an etching mixture drawn in as a solid dot having the abbreviated designation CP-8 which has been tried out in connection with the process according to the invention and is further described later. Finally, the line appertaining to the ratio 1:3 represents the lower limit for the use of a photoresist mask.

Now, suitable for the clean etching of recesses with good surface quality are, in particular, $HNO_3$-rich polishing etching mixtures whose $HF$:$HNO_3$ ratio lies markedly below the 1:1 line which has been drawn in.

The differences between a process employing $SiO_2$ mask layer and one employing photoresist mask can be made clear from the first exemplary embodiment, the etching of a double trench, by comparing FIGS. 2A-E and 3A-I:

A conventional process employing photoresist mask (FIGS. 2A-E) starts from a silicon substrate 1 (FIGS. 2A-E) with a flat surface. The layer structures necessary for the semiconductor component may already have been introduced into said silicon substrate 1.

A thin photoresist layer is now applied (for example, spun on) to the silicon substrate 1, thermally treated and photolithographically structured to form a first resist mask 3 (FIG. 2B) which has suitable openings in the regions in which the double trench is to be produced.

A deep first trench 6, which appears rounded because of the isotropic etching characteristics (FIG. 2C), is etched into the silicon substrate 1 through said openings in a first etching step using a relatively $HNO_3$-poor etching mixture.

After termination of the first trench etching, the resist mask 3 is removed and a second photoresist mask is applied and structured to form a second resist mask 3' (FIG. 2D). The openings in said second resist mask 3' then determine the regions of a shallow second trench 7 which is etched into the silicon substrate 1 in a second etching step (FIG. 2E). The superimposition of first trench 6 and second trench 7 forms the double trench (double moat) such as is used as passivation trench in power semiconductor components.

It is immediately plausible that, in addition to the other disadvantages associated with a photoresist mask, particular problems occur in the process just described, in particular as a result of the interdigitation of etching and masking steps because of the reaction and contamination of freshly etched surfaces associated therewith.

In the exemplary embodiment of the process according to the invention, as it is represented in FIGS. 3A-I, these problems are reliably avoided:

Here, too, the starting point is the silicon substrate 1 (FIG. 3A), on which a uniform $SiO_2$ mask layer 2, which is extremely intimately joined to the silicon substrate 1, is produced by thermal growth (FIG. 3B).

Analogously to FIG. 2B, a first photoresist layer is now applied to the mask layer 2 and structured to form a first resist mask 3 (FIG. 3C). The mask layer 2 in a mask opening 4 is completely removed through the opening of the first resist mask 3 using an etch suitable for $SiO_2$ (FIG. 3D).

Analogously to FIG. 2D, a second photoresist layer is applied after dissolving the first resist mask 3 and structured to form a second resist mask 3' (FIG. 3E).

In the region of the opening of the second resist mask 3', the mask layer 2 is then removed to such an extent that a mask step 5 is produced, and the mask layer 2 therefore has a stepped thickness profile (FIG. 3F). The introduction of the mask step 5 into the mask layer 2 and the removal of the second resist mask 3' completely terminates the masking process and there follow only "clean" etching steps (FIGS. 3G-I).

In this case, the deep first trench 6 is excavated through the mask opening 4 using the etching mixture containing HF and $HNO_3$ (FIG. 3G).

There follows an unmasked removal over the whole surface of the mask layer 2 until the mask step 5 has been completely removed and the silicon substrate 1 is also uncovered in this region (FIG. 3H).

Finally, the shallow second trench 7 is etched into the silicon substrate 1 through the enlarged opening in the mask layer 2 (3I). The edge undercut produced because of the reduced etching rate is indicated at the edges of the mask layer 2 both in FIG. 3G and in FIG. 3I.

From the exemplary embodiment shown in FIGS. 3A-I it can be seen that, to etch a recess with stepped depth profile, a similar structure with stepped thickness profile can be fabricated beforehand in the mask layer so that, after termination of the mask production, it is necessary to carry out only etching steps which neither contaminate freshly etched surfaces nor are impaired by organic substances.

Similarly to the manner in which a recess with stepped depth profile can be produced by a mask layer with stepped thickness profile fabricated beforehand, it is also possible to achieve a recess with a bevel at the edge by means of a mask layer, fabricated beforehand, with a mask wedge at the mask edge (FIGS. 4A-D).

Figure 4A:
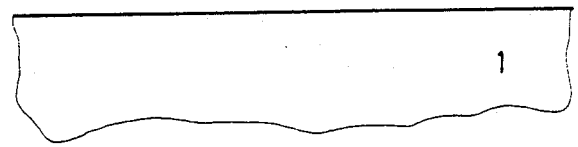
FIGS. 4A–D show various steps in the etching of a recess with bevel according to a second exemplary embodiment of the invention.
Figure 4B:
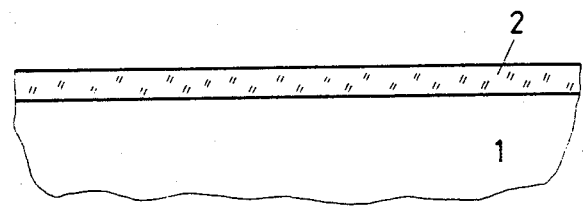
Figure 4C:
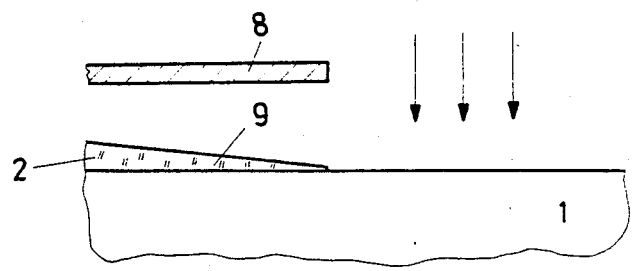
Figure 4D:
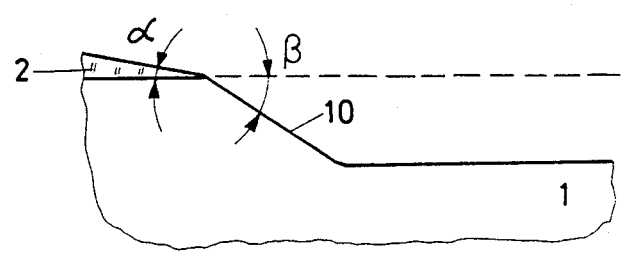

In this case, too, the starting point is also the silicon substrate 1 (FIG. 4A), on which the $SiO_2$ mask layer 2 is produced by thermal growth (FIG. 4B).

If the openings necessary for etching the recess are etched into said mask layer 2 by means of the known reactive ion etching process through an aperture arranged at a finite distance above the mask layer (FIG. 4C) a mask wedge 9 is produced by shadow casting in the region of the aperture edge, i.e. the region of the mask layer 2 situated at the edge of the opening has a wedgeshaped bevel.

During the subsequent etching of the recess with the acid mixture, the mask wedge is gradually removed from the opening end and the region of the silicon substrate 1 situated thereunder is gradually exposed to etching attack so that there is produced at the edge of the recess a bevel 10 whose bevel angle $\beta$ bears the following relationship to the wedge angle α of the mask wedge 9:

$$tg\beta/tg\alpha\ R_{Si}/R_{SiO2},$$

where $R_{Si}$ and $R_{SiO2}$ are the etching rates of the acid mixture for Si and SiO$_2$ respectively and tg refers to tangent.

In appropriate experiments using several etching mixtures, both the stepped and the obliquely sloping depth profile were achieved. In total, three etching mixtures were tested:

No. 1 (CP-8): 270 ml of HF (50%) +270 ml of CH$_3$COOH (99.5%) +450 ml of HNO$_3$ (65%)

No. 2 (Monsanto): 156 ml of HF (50%) +218 ml of CH$_3$COOH (99.5%) +500 ml of HNO$_3$ (100%) (converted to % by volume, this corresponds to 18% by volume of HF +25% by volume of CH$_3$COOH +57% by volume of HNO$_3$)

No. 3 (trench 230 ml of HF (50%) +470 ml of HNO$_3$ etchant): (65%) +200 ml of CH$_3$COOH (100%) +100 ml of H$_3$PO$_4$ The percentages specified in brackets represent the initial concentration in each case.

No. 2 (Monsanto) proved to be the best etching mixture, with an $R_{Si}/R_{SiO2}$ etching rate ratio of 100:1. In the case of mixture No. 3, however, this ratio is still a usable 50:1. Of all three etching mixtures, the mixture no. 1 (CP-8) has the most unfavourable HF:HNO$_3$ ratio in relation to defect-free etching and therefore does not appear as well suited.

A double trench (stepped depth profile) was etched in a quality never achieved so far using etching mixture No. 2 at a temperature of 25° C. Outside the mask step 5 the thickness of the mask layer 2 was in this case about 1 μm (precisely: 0.98 μm) and inside the mask step 5 it was about 0.45 μm (precisely: 0.44 μm). The etching sequence was in this case as follows:

(a) No. 2: 4 min at 25° C.,
(b) SiO$_2$ etch: 1.5 min at 25° C., and
(c) No. 2: 1 min at 25° C.

Figure 5:
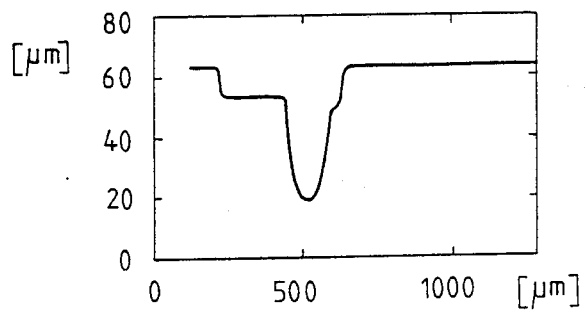
FIG. 5 shows the measured depth profile of a double trench produced according to FIGS. 3A–I.

With these, etching depths of 44 μm in the first trench 6 and 10 μm in the second trench 7 were achieved. The measured resulting depth profile is reproduced in FIG. 5, zero points being arbitrarily chosen on both axes.

Figure 6:
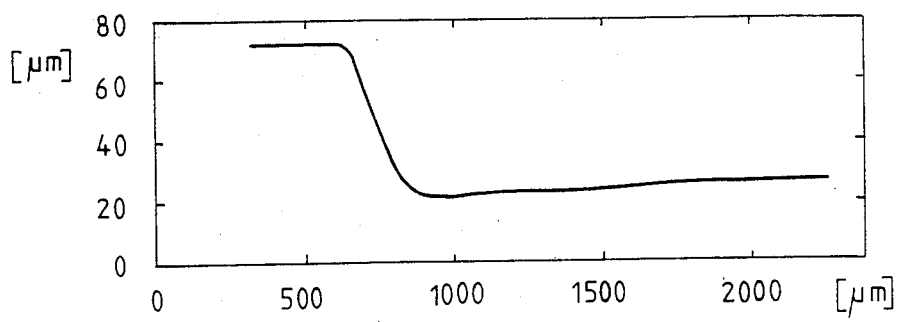
FIG. 6 shows the measured depth profile of a bevel produced according to FIGS. 4A–D.

A corresponding measured depth profile for a recess with bevel is shown in FIG. 6. The mask wedge 9 of the SiO$_2$ mask layer 2 with a thickness of about 1 μm (precisely: 0.98 μm) had in this case a wedge angle α with tgα=approx. 0.002; the etching was again carried out with etching mixture No. 2. The resulting bevel 10 with a bevel angle β with tgβ=approx. 0.22 differs only slightly from the shape to be expected according to the above equation.

All in all, the invention makes available a process for etching complicated structures which not only overcomes the problems associated with a resist mask but also results in particularly good etching results as a result of the strict separation of masking and etching steps.

Obviously, numerous modifications and variations of the present invention are possible in the light of the above teachings. It is therefore to be understood that within the scope of the appended claims, the invention may be practised otherwise than as specifically described herein.

What is claimed as new and desired to be secure by Letters Patent of the United States is:

1. A process for etching recesses in a silicon substrate, wherein said recesses have the form of a double trench with a stepped depth profile, which double trench is composed of a deep first trench and a shallow second trench adjacent to said deep first trench, said process comprising the steps of:

coating said silicon substrate with an etch-resistant SiO$_2$ mask layer;

creating in predetermined regions of said SiO$_2$ mask layer a stepped thickness profile with openings in said SiO$_2$ mask layer and regions of reduced mask layer thickness adjacent to said openings;

thereafter etching the silicon substrate without the presence of a photoresist in a series of steps consisting essentially of: etching, in a first etching step, wet-chemically through said openings in said SiO$_2$ mask layer said first trenches into said silicon substrate, with an etching mixture containing HF and HNO$_3$;

reducing, in a second etching step which directly follows said first etching step, the overall thickness of said SiO$_2$ mask layer, such that, within said regions of previously created reduced mask layer thickness, said mask layer is completely removed; and etching, in a third etching step which directly follows said second etching step, through said regions where the SiO$_2$ mask layer is completely removed wet-chemically said second trenches into said silicon substrate, with said etching mixture.

2. The process as claimed in claim 1, wherein said mask layer is composed of thermally grown SiO$_2$.

3. The process as claimed in claim 2, wherein an HNO$_3$-rich polishing acid mixture is used as said etching mixture.

4. The process as claimed in claim 3, wherein an etching mixture is used which has a ratio of etching rates for Si and SiO$_2$ of greater than or equal to 100:1.

5. The process as claimed in claim 4, wherein said etching mixture has the following composition:

about 18% by volume of 50% HF;
about 25% by volume of 99.5% strength CH$_3$COOH; and
about 57% by volume of 100% strength HNO$_3$.

6. The process as claimed in claim 1, wherein, outside said predetermined regions, said mask layer has a thickness of about 1 μm and, inside said regions of reduced thickness, it has a thickness of about 0.45 μm.

7. A process for etching recesses in a silicon substrate, wherein said recesses have a bevel at the edge, said process comprising the steps of:

coating said silicon substrate with an etch-resistant SiO$_2$ mask layer;

patterning said mask layer to form openings in said mask layer with edges which are sloped and constitute wedges; and etching said recesses through said openings into said silicon substrate, thereby producing said bevels by continuous removal of said wedges during said etching step.

8. The process as claimed in claim 7, wherein, outside said wedges, said mask layer has a thickness of about 1 μm, and said wedges have a wedge angle α with tgα=approx. 0.002.

9. The process as claimed in claim 7, wherein said patterning comprises removing said mask layer by means of reactive ion etching through an aperture arranged at a finite distance above said mask layer.

* * * * *